United States Patent [19]

Diamand

[11] 4,286,276
[45] Aug. 25, 1981

[54] DUAL SCHOTTKY CONTACT AVALANCHE SEMICONDUCTOR STRUCTURE WITH ELECTRODE SPACING EQUAL TO EPI LAYER THICKNESS

[75] Inventor: Félix Diamand, Paris, France

[73] Assignee: Thomson-CSF, Paris, France

[21] Appl. No.: 21,767

[22] Filed: Mar. 19, 1979

[30] Foreign Application Priority Data

Mar. 21, 1978 [FR] France ................... 78 08144

[51] Int. Cl.$^3$ .................................. H01L 29/90
[52] U.S. Cl. ..................................... 357/13; 357/15
[58] Field of Search ................................ 357/13, 15

[56] References Cited

U.S. PATENT DOCUMENTS

| Re. 27,052 | 2/1971  | Memelink et al. | 357/13 |
|------------|---------|-----------------|--------|
| 3,111,590  | 11/1963 | Noyce           | 357/13 |
| 3,566,213  | 2/1971  | Kaiser          | 357/13 |
| 3,622,844  | 11/1971 | Barelli et al.  | 357/15 |
| 3,675,092  | 7/1972  | Kocsis et al.   | 357/13 |
| 3,684,901  | 8/1972  | Krober          | 357/13 |
| 3,739,243  | 6/1973  | Semicon et al.  | 357/15 |
| 3,760,241  | 9/1973  | Epple           | 357/15 |

FOREIGN PATENT DOCUMENTS

| 1060208 | 3/1967 | United Kingdom . |
| 1138799 | 1/1969 | United Kingdom . |
| 1439217 | 6/1976 | United Kingdom . |
| 2002582 | 2/1979 | United Kingdom . |

OTHER PUBLICATIONS

J. Irvin et al., "Nonohmic contacts for Microwave Devices," Proc. IEEE, vol. 58 #11, Nov. 1970, pp. 1845-1846.

H. Eichengerger et al., "Integrable Fet Device," IBM Tech. Discl. Bull, vol. 13 #11, Apr. 1971, p. 3216.

A. Winstanley et al., "Transistor Improvements using an Impatt Collector," Elec. Lett., vol. 10 #24, Nov. 28, 1974, pp. 516-518.

K. Kirose et al., "Improved Design . . . P-N JCN., "J.J.A.P., vol. 16, 1977, pp. 311-315.

Primary Examiner—Joseph E. Clawson, Jr.

[57] ABSTRACT

A semiconductor structure comprising two conventional electrodes of an avalanche diode and furthermore a supplementary electrode. In a preferred embodiment the conventional and supplementary electrodes form two combs of which the teeth are intermingled and separated from one another by intervals of the same order of magnitude as the thickness of the active layer wherein the avalanche rises. There are two functioning cases. In a first case the biassing voltage applied to the supplementary electrode is lower than the breakdown voltage and the operating conditions of the avalanche diode is optimised or controlled as in a modulator or a frequency shifter. In a second case the biassing voltage applied to the supplementary electrode is higher than the breakdown voltage and the power and/or efficiency of an amplifier or oscillator using such a structure is increased.

7 Claims, 7 Drawing Figures

DUAL SCHOTTKY CONTACT AVALANCHE SEMICONDUCTOR STRUCTURE WITH ELECTRODE SPACING EQUAL TO EPI LAYER THICKNESS

This invention relates to a new semiconductor structure which is capable of operating as a very high frequency oscillator or amplifier based on the avalanche phenomenon, comprising an electrode in addition to the conventional electrodes of the avalanche diode. The invention also relates to a device comprising a semiconductor component exhibiting this new structure.

It is known that negative-resistance devices, where they comprise an input channel and an output channel operating at very high frequency, require a decoupling element, such as a circulator. An element such as this has disadvantages, particularly with regard to its dimensions, in addition to limitations in band width and gain. The invention aims at eliminating these disadvantages and limitations. In addition, the invention has other advantages.

According to the invention there is provided a semiconductor structure based on the avalanche phenomenon, comprising a semiconductor substrate, at least one layer of semiconductor material adjacent a large face of the substrate, forming the active region of the structure, and at least one first metallic deposit or a first series of metallic deposits on the external surface of said layer the structure further comprising, in the vicinity of at least one first deposit, a second metallic deposit, the distance between first deposit and second deposit being of the same order of magnitude as the thickness of the active region.

The invention will be better understood and other features thereof will become apparent from the following description considered in conjunction with the accompanying drawings, wherein.

The invention uses a particular effect which is comparable with a control gate effect and which appears when and electrode is added in the immediate vicinity of an electrode of an avalanche diode structure situated adjacent the active layers of this structure, for example adjacent a Schottky contact forming the junction of the diode.

Figure 1:
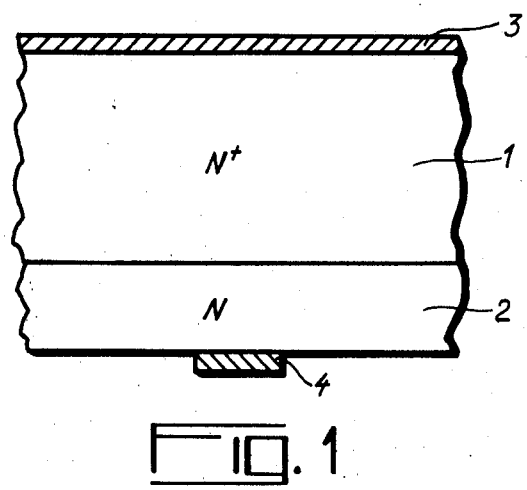
FIG. 1 shows a known semiconducting structure.
Figure 2:
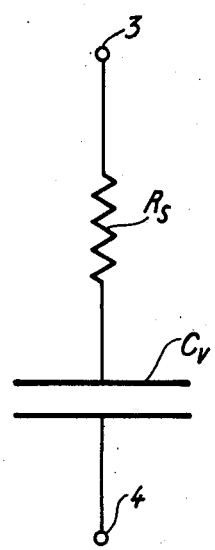
FIGS. 2 and 3 are explanatory circuit diagrams relating to the prior art.
Figure 3:
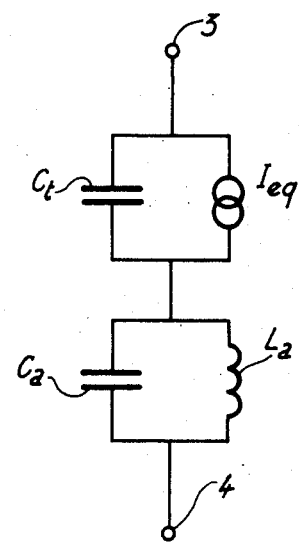

In order to enable this gate effect to be understood, reference is made to the equivalent diagrams in FIGS. 2 and 3 relating to a semiconductor structure of the avalanche diode type shown in FIG. 1. FIG. 1. shows partly in section a substrate 1, for example of gallium arsenide heavily doped with $N^+$-type impurities, comprising two large faces respectively covered by an epitaxial layer 2 and a metallic layer 3 forming an ohmic contact.

In the example selected, it is assumed that the Schottky contact 4 only occupies a small part of the free surface of the layer 2, i.e. for example a band of which the largest dimension extends in a plane perpendicular to the plane of the FIG. This contact is formed for example by a band of platinum deposited by vacuum evaporation after preliminary masking of the surface in question by a photosensitive resin, then exposure and photographic development.

The layer 2 may have a non-uniform doping. For example, it may comprise a weakly doped layer ($10^{15}$ atoms/cc to $10^{16}$ at/cc of N-type impurities) between two more heavily doped layers ($10^{17}$ to $10^{18}$ at/cc of N-type impurities) in the case of a structure of the so-called "low-high-low" type.

A structure such as this is biassed to apply an inverse voltage to the Schottky junction, i.e a negative potential to the contact 4 in relation to the contact 3. It is known that the structure biassed by a voltage of absolute value V behaves:

(a) as a variable-capacitance diode where V is below the breakdown voltage of the semiconductor material;

(b) as an avalanche diode in the opposite case.

In case (a), the structure has a circuit diagram with lumped parameters equivalent to the diagram of FIG. 2 which shows a resistance $R_s$ representing the total ohmic resistance of the structure in the case of backward biassing and $C_v$ representing a capacitance variable in dependence upon V.

In case (b), the structure has a circuit diagram with lumped parameters equivalent to the diagram of FIG. 3 which shows in series:

a first circuit corresponding to the actual avalanche zone where there is a resonant circuit comprising in parallel a capacitance $C_a$ and an inductance $L_a$. In more complex cases, there may be a transit zone on either side of the avalanche zone which is not the case in the example selected but which nevertheless falls within the scope of the invention;

a second circuit corresponding to a so-called transit zone and comprising, in parallel, a current generator $I_{eq}$ and a capacitance $C_t$.

Figure 5:
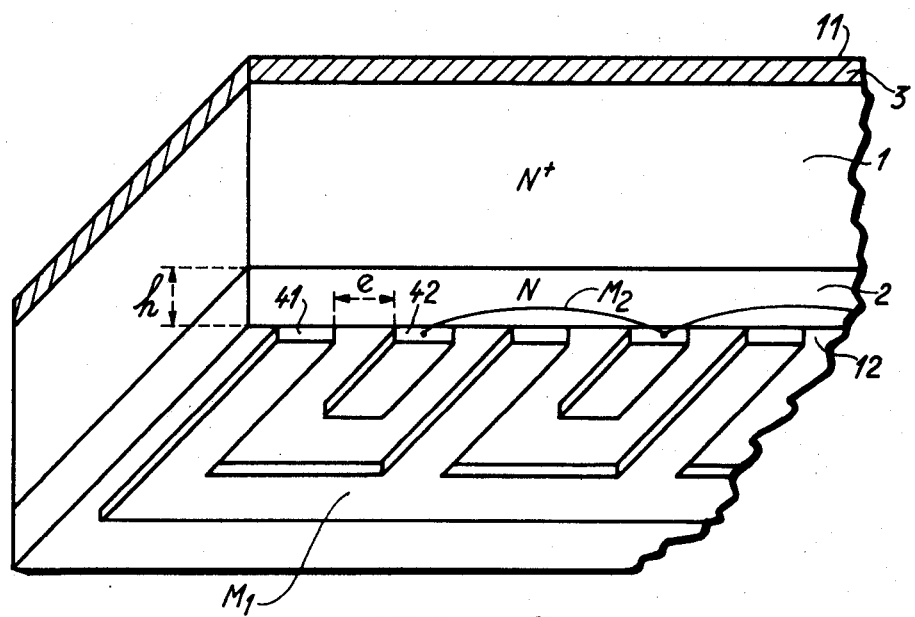
FIGS. 5, 6 and 7 show examples of embodiments of the invention.

As one example of the structure according to the invention, there will now be considered a parallelepiped of gallium arsenide comprising a substrate 1 doped with $N^+$-type impurities and a layer 2 doped with N-type impurities, the external surface of this layer forming one of the two large parallel faces 11 and 12 of the structure as a whole (FIG. 5). Only a fraction of the parallelepiped has been shown, being situated on one side of a section through a plane perpendicular to the large faces. The face 11 comprises an ohmic contact 3 whilst the face 12 supports two Schottky contacts forming two interdigital combs. One of the combs of spine $M_1$ and teeth 41 is shown in part. Parts only of the teeth 42 of the other comb are visible. A connection $M_2$ between the teeth 42 diagrammatically represents the connection existing between them in the form of metallic deposits which are not visible in FIG. 5. If, according to one feature of the invention, h is the thickness of the layer 2 and e the distance between one tooth 41 and the adjacent tooth 42, there should be little difference between these two dimensions.

For similar dimensions of h and e, of from one micron to a few microns, the operating conditions of the avalanche diode formed by one of the combs are significantly influenced when the bias applied to the other comb is varied in such a way that it either remains below the breakdown voltage (first case) or reaches or exceeds the breakdown voltage (second case). Numerical calculations and rheographic measurements confirm the results obtained. The equivalent diagrams are similar to that of FIG. 4 drawn in the second case. This is because the voltages applied to the two combs are greater than the breakdown voltage, and, as a consequence, there are two equivalent diagrams of the type shown in FIG. 4, on the one hand between the electrodes 31 and 41 and on the other hand between the electrodes 32 and 42. However, in the case of the proximity of the teeth of the combs, there has to be added to this diagram a coupling capacitance which, in the interests of simplicity, is shown as a lumped one $C_I$ between the middle points of the two branches.

Figure 4:
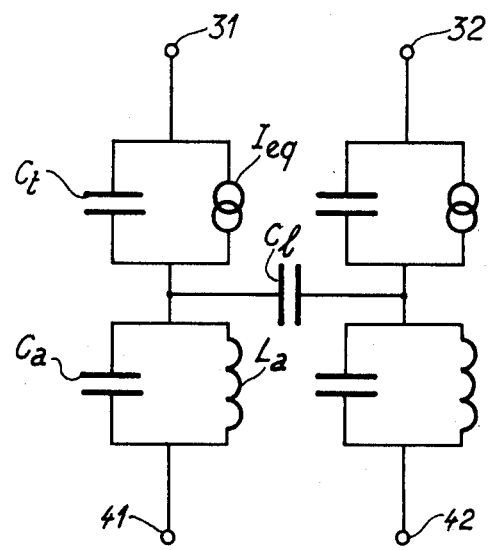
FIG. 4 is a circuit diagram relating to the invention.

In the first case, the diagram of FIG. 4 has to be modified by replacing one of the branches by the diagram of FIG. 2. As a result, case (a) applies to one of the electrodes and case (b) to the other electrode. For example, for the electrode 42, the backward biassing voltage applied is lower in absolute value than the breakdown voltage and the equivalent diagram is that shown in FIG. 2 (variable capacitance $C_V$ in series with a resistance $R_S$), whereas for the electrode 41 the biassing voltage exceeds the breakdown voltage and the equivalent diagram is that of an avalanche diode.

One example of this first case is described hereinafter with the following characteristics:

Semiconductor material: gallium arsenide $N^+$-type doping: with a density of $2.10^{18}$ at/cm$^{+3}$ N-type doping: with a density of $10^{16}$ at/cm$^{+3}$ (flat-profile diode)

Thickness of the active layer (h): 3 microns

Tooth width of the comb 41 or 42: 3 microns

Free space between teeth (e): 3 microns

Breakdown voltage of the material: 70 volts

Voltage between comb 41 and contact 3: $-70$ to $-100$ V

Voltage between comb 42 and contact 3: variable from $-30$ to $-70$ V.

The following results are obtained:

(1) The voltage between the comb 42 and the contact 3 may be adjusted to optimise the operating conditions of the avalanche diode and, in practice, to obtain a greater useful power for the same feed voltage.

In this case, the invention may serve to compensate the doping faults, for example in the case of a very sophisticated profile such as the 37 low-high-low". For production on an industrial scale, it may be less expensive to add an additional electrode and an adjustable bias than to perfect the doping technology.

(2) The comb 42 may be used as a control gate:

either to amplify or modulate a high-frequency signal;

or to modify the frequency of an oscillator formed by an avalanche diode according to the invention.

One example of the application of the invention to an amplifier is described hereinafter with reference to FIG. 6. A structure according to the invention is produced in the form of a semiconductor block 60 comprising the combs 41 and 42 and an ohmic contact 3 (not shown) at the ground of the amplifier. Connected in parallel to the comb 42 acting as control gate, between this comb and ground, are a biassing source 61 in series with an inductance 62;

a high frequency source 65 in parallel with an impedance 64, the whole being connected to the comb 42 through a capacitor 63.

Connected in parallel to the comb 41 acting as the output terminal of the amplifier are:

a load circuit symbolically represented by an impedance 69 connected to the comb 41 by a connecting capacitor 68;

a biassing source 66 in series with an inductance 67.

The amplifier described above operates with a minimal current (so-called starting current) which is more reduced than in a more conventional avalanche diode structure used as an amplifier. The frequency band in which it is capable of effective amplification is wider than in the conventional structure.

Figure 6:
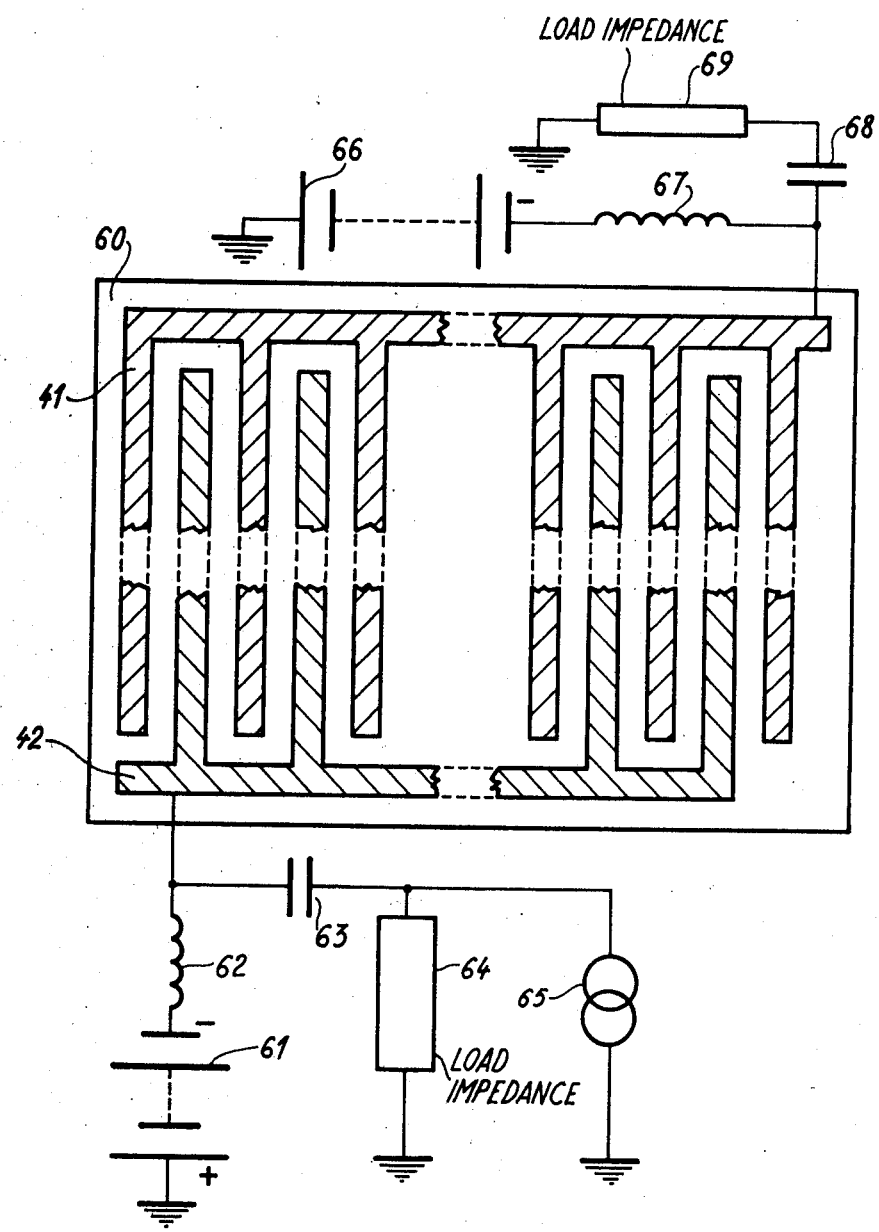

The circuit arrangement shown in FIG. 6 may be modified to form an oscillator by eliminating the source 65 and by coupling the output of the comb 41 with the input of the comb 42. An oscillator such as this may be tuned to a wider frequency range than an oscillator comprising an avalanche diode with similar characteristics, but a conventional structure.

An explanation of the operation of the structure according to the invention may be facilitated by rheographic measurements on an experimental model simulating the structure shown in FIG. 6. It is found that, when the biassing voltage applied to the comb 42 is varied, the voltage drop in the avalanche region varies by 15% at the centre of a comb tooth and by more than 20% at the boundary of said region.

In the second case mentioned above, i.e where a backward biasing voltage higher in absolute value than the breakdown voltage is applied to one and the other comb, possibly with different voltages, two mutually coupled avalanche diodes operate in parallel. In this case, the power losses are reduced and, hence, output improved. In the case of an amplifier identical with that shown in FIG. 6, but operating under the conditions of the second case, it is possible to obtain a greater overall power, all things otherwise being equal, with an excellent efficiency. However, stability in operation is lower than in the first case.

Figure 7:
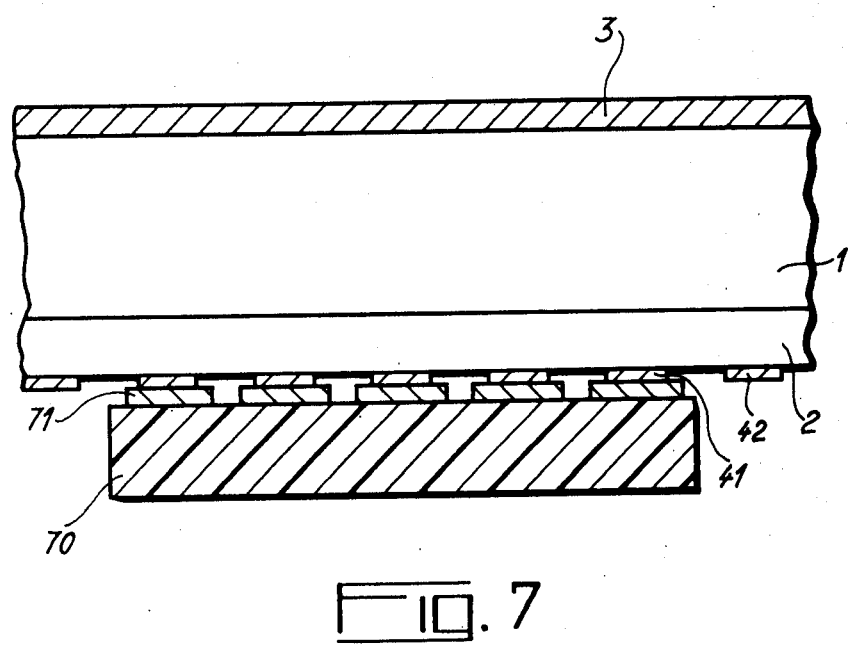

In every case where it is desired to extract relatively high electrical power from the structure in relation to its dimensions, a considerable flow of heat emanating from the active layers of the semiconductor material has to be evacuated by thermal conduction. An excellent way of achieving this flow along a path of low thermal resistance is to braze a diamond block 70 shown in FIG. 7 on that side of the structure where the combs 41 and 42 are situated. In this case, the face of the block 70 to be brazed has to be metallised beforehand by forming deposits 71 in the form of parallel bands separated by the same intervals as the teeth of the combs 41 and 42 and having the same or a slightly greater width. The block 70 does not completely cover the combs, enabling them to be connected by lateral branching.

By virtue of the diamond, an electrical insulator of higher thermal conductivity than copper, low thermal resistance is obtained whilst, at the same time, a suitable insulation is maintained between the combs 41 and 42.

What I claim is:

1. A semiconductor structure based on the avalanche phenomenon, comprising a semiconductor substrate of a predetermined conductivity type, at least one layer of semiconductor material of the same conductivity type doped with a lower density of doping impurities than the substrate, forming the active region of the avalanche structure, having a thickness in the range of $10^{-6}$ meter to several $10^{-6}$ meters, and at least one first Schottky contact on the external surface of said layer, the structure further comprising, in the vicinity of said first Schottky contact, a second Schottky contact, the distance between said first and said second Schottky contacts being substantially equal to the thickness of the active region.

2. A structure as claimed in claim 1, wherein the first and second Schottky contacts are in the form of interdigital combs.

3. A structure as claimed in claim 2, wherein said combs are covered by a block of diamond used as heat dissipator.

4. An amplifier comprising a structure as claimed in claim 1, comprising a first biassing source capable of supplying said first Schottky contact with a fixed voltage higher in absolute value than the breakdown voltage of the semiconductor material and a second biassing source supplying said second Schottky contact a voltage variable over a range of values below and above the breakdown voltage.

5. An oscillator comprising a structure as claimed in claim 1, comprising a first biassing source capable of supplying said first Schottky contact with a fixed voltage higher in absolute value than the breakdown voltage of the semiconductor material and a second biassing source supplying said second Schottky contact a voltage variable over a range of values below or above the breakdown voltage.

6. A semiconductor structure as claimed in claim 1, wherein said semiconductor substrate is N+ doped with a density higher than $10^{18}$ donor impurities per $cm^3$, said active layer being N doped with a density of from $10^{15}$ to $10^{16}$ donor impurities per $cm^3$.

7. A semiconductor structure as claimed in claim 1, wherein said active layer is N-doped with a density of from $10^{15}$ to $10^{16}$ donors per $cm^3$ and is located between two N-doped layers having densities from $10^{17}$ to $10^{18}$ donors per $cm^3$.

* * * * *